United States Patent [19]
Kawamoto et al.

[11] Patent Number: 5,356,698
[45] Date of Patent: Oct. 18, 1994

[54] ADHESIVE AGENT FOR SUBSTRATE OF ELECTROLESS PLATING, PRINTED CIRCUIT BOARD USING SAME, AND METHOD OF PRODUCING SAME

[75] Inventors: Mineo Kawamoto; Haruo Akahoshi, both of Hitachi; Akio Takahashi, Hitachioota; Akio Mukoh, Mito; Kazuo Tanje, Katsuta; Toyofusa Yoshimura, Naka; Tokihito Suwa, Katsuta; Iwao Kaminaga, Hitachi; Toshiyuki Chida, Naka, all of Japan

[73] Assignee: Hitachi, Ltd., Tokyo, Japan

[21] Appl. No.: 705

[22] Filed: Jan. 5, 1993

Related U.S. Application Data

[63] Continuation of Ser. No. 674,691, Mar. 25, 1991, abandoned.

[30] Foreign Application Priority Data

Mar. 27, 1990 [JP] Japan ..................................... 2-77830

[51] Int. Cl.⁵ ............................................... B32B 9/00
[52] U.S. Cl. .................... 428/209; 428/323; 428/327; 428/355; 428/901; 427/97; 430/15
[58] Field of Search ............................. 430/15; 427/97

[56] References Cited

U.S. PATENT DOCUMENTS 4,305,975 12/1981 Ikari et al. ............................. 427/97
4,378,384 3/1983 Murakami et al. .................... 427/97

FOREIGN PATENT DOCUMENTS 62-72194 4/1987 Japan .
1516511 4/1975 United Kingdom .................... 59/68
1512982 6/1978 United Kingdom .................... 213/4

Primary Examiner—Patrick J. Ryan
Assistant Examiner—Kam F. Lee
Attorney, Agent, or Firm—Antonelli, Terry, Stout & Kraus

[57] ABSTRACT

Adhesive agent for substrate of electroless plating characterized in comprising epoxy resin, synthetic rubber, and phenolic resin as main components, a hardener of the epoxy resin, inorganic filler having hydroxyl group, and solvent.

The adhesive agent is hardened at relatively low temperature (about 150° C.) in short period (within 30 minutes) without giving warp and distortion to the insulation substrate, and moreover its insulation resistance after hardening is high.

The adhesive agent is preferable as an adhesive agent for a printed circuit board.

32 Claims, 2 Drawing Sheets

ADHESIVE AGENT FOR SUBSTRATE OF ELECTROLESS PLATING, PRINTED CIRCUIT BOARD USING SAME, AND METHOD OF PRODUCING SAME

This application is a continuation application of application Ser. No. 07/674,691, filed Mar. 25, 1991, now abandoned.

BACKGROUND OF THE INVENTION

The present invention relates to a adhesive agent for a substrate for electroless plating of printed circuit board, an adhesive film which is made of a base film coated with the adhesive agent, and a printed circuit board using the adhesive agent.

A printed circuit board, in which circuit is formed by electroless plating on surface of an insulating substrate, has an adhesive layer on the substrate which is formed for adhesion of films of electroless plating.

As for the adhesive agent of the adhesive layer, agents which are composed mainly of epoxy resin, synthetic rubber, and phenolic resin (JP-B-45-9843 (1970), JP-A-58-57776 (1983), JP-A-59-62683 (1984), JP-A 62-248291 (1987), JP-A-63-277772 (1988)), and of synthetic rubber and phenolic resin (JP-B-60-5079 (1985), JP-A-63-213676 (1988), JP-A-63-213677 (1988)) are disclosed.

As for the adhesive agents described above, the adhesive agents comprising imidazole group compounds, amine group compounds, acid anhydride compounds, and novolak type phenolic resin etc. as a hardener for the epoxy resin, and further, resol type phenolic resin and sulfur compounds etc. as a vulcanizing agent, and metal oxides such as zinc oxide and magnesium oxide etc. as a vulcanization accelerator are used.

The adhesive layer described above is etched with a mixture of chromic acid and sulfuric acid etc. for improving of peeling strength and resistance against soldering heat of the film of electroless plating by making a surface of the layer rough and adding an anchor effect to the surface. Further, to raise the anchor effect, some of the adhesive layer comprises inorganic fillers such as calcium carbonate, calcium silicate, silicon oxide, zirconium silicate, and titanium oxide.

The adhesive layer described above is formed by a method comprising the steps of adding solvent to the adhesive agent, applying the solution on the surface of the insulating substrate by any of dipping process, roll coating process, and curtain coating process etc., drying, and hardening by heating.

Conventionally, heating at 150°–200° C. for 30–120 minutes is necessary for hardening of the adhesive agent described above as disclosed in JP-A-62-248291 (1987).

But actually, even though the heating at 150°–200° C. for 30–120 minutes is able to harden epoxy resin, the heating is insufficient for reaction of synthetic rubber with its vulcanizing agents such as phenolic resin or sulfur compounds, and consequently, problems of low insulation resistance of the adhesive layer, swelling of the adhesive layer by stress with deposition of the plating film at the electroless plating, and low peeling strength and low resistance against soldering heat of the plating film are caused. Therefore, generally speaking, hardening by heating at lowest 160° C. for at least 60 minutes is performed actually as disclosed in JP-A-62-248291 (1987).

Recently, thickness of a printed circuit board is becoming thinner year by year, and 0.8–1 mm in a case of paper phenolic laminate board and 0.5–1 mm in a case of glass epoxy laminate board is required for thickness of the insulating substrate. And, a fine circuit having at most 0.1 mm for width of a conductive circuit which is formed on the surface of the insulating substrate or for a space between the conductive circuits is required. By forming the adhesive layer on such a thin insulating substrate and hardening at lowest 160° C. for at least 60 minutes, warp and distortion of the insulating substrate occurs, and a problem of difficulty in printing of resist ink and adhesion of dry film type resist, due to the warp and the distortion of the substrate, in a plating resist coating process which is a preprocess of the electroless plating, is caused.

In a case of using a paper phenolic laminate board as the substrate, the paper in the substrate is deteriorated by heat, and there is a problem of causing cracks between next through holes and between perforated small holes, and of cutting sections becoming worm-eating pattern.

On the other hand, although high insulation resistance is required for an interval between conductive circuits which are formed by electroless plating, a value of insulation resistance after hardening of an adhesive layer using a conventional adhesive agent is about $10^{11}$–$10^{13}$ Ω, and the value is not sufficient for the insulation resistance of the adhesive layer upon which a fine circuit, having an interval between circuits of at most 0.1 mm, is mounted.

One of the objects of the present invention is to provide an adhesive agent for a substrate for electroless plating, which is hardened at relatively low temperature (about 150° C.) in a short time (within 30 minutes) without giving warp and distortion to the substrate, and, further, yields an adhesive layer having high insulation resistance after the hardening, and a printed circuit board using the adhesive agent.

Further, another object of the present invention is to provide an adhesive film which is formed by coating of the adhesive agent on a base film and yields an adhesive layer for a substrate for electroless plating.

SUMMARY OF THE INVENTION

The gist of the present invention for achieving the objects described above is related to an adhesive agent which is characterized in having epoxy resin, synthetic rubber, and phenolic resin as main components, and being mixed with hardening agents for the epoxy resin and an inorganic filler having a hydroxyl group as a reaction accelerator of the reaction between thee synthetic rubber and the phenolic resin.

A preferable mixing ratio of the epoxy resin/synthetic rubber/phenolic resin as the main components of the adhesive agent is (15–40)/(40–60)/(20–40) by weight, and a necessary quantity; of the hardening agent for the epoxy resin. Especially photosensitive aromatic onium salt, is preferably 0.2–5 parts by weight to 100 parts by weight of the total resin component described above. And, the inorganic filler having hydroxyl group is preferably mixed 3–20 parts by weight.

The adhesive agent of the present invention is hardened after shaping by applying on a surface of an insulating substrate etc. by thermosetting, but the adhesive agent which uses photosensitive aromatic onium salt as a hardening agent of the epoxy resin is hardened by heating after irradiation of ultraviolet ray.

The sufficient irradiation dose of the ultraviolet ray is 0.5–3 J/cm$^2$ at a wave length of 365 nm. The photosensitive aromatic onium salt is decomposed by irradiation of the ultraviolet ray and releases Lewis acid which is a hardening seed for the epoxy resin, and consequently hardening at a somewhat relatively low temperature can occur. Therefore, the thermal distortion at the hardening process is less than distortion when using conventional hardening agents, and an effect is brought that the distortion of the substrate etc. at the formation of the adhesive layer becomes small. Nevertheless, the epoxy resin can not be hardened completely by the irradiation of the ultraviolet ray. Thermal energy is also necessary for complete hardening of the epoxy resin. If the irradiation apparatus of ultraviolet ray releases infrared ray concurrently and is able to heat the adhesive layer up to 135°–150° C., the epoxy resin can be hardened completely. Either of an infrared lamp and a conventional heating furnace can be used as a heating source.

As for the epoxy resin, conventional epoxy resin can be used, but bisphenol A type epoxy resin having epoxy equivalent of 450–2100 g/eq is preferable.

The inorganic filler having hydroxyl group accelerates the reaction between the synthetic rubber and the phenolic resin, and sufficient hardening can be achieved by heating at 135°–150° C. for 20–30 minutes and an adhesive layer having high insulation resistance can be obtained. Without the inorganic filler having hydroxyl group, heating at least 160° C. for more than 60 minutes is necessary.

As for the synthetic rubber, the following rubbers are usable: acrylonitrile-butadiene rubber, acrylonitrile-butadiene rubber containing isoprene, acrylonitrile-butadiene rubber containing carboxyl group, and styrene-butadiene rubber etc.

As for the phenolic resin, resol type phenolic resin has good reactivity with the synthetic rubber, and especially, alkyl-denatured or cashew denatured phenolic resin among the resol type phenolic resin is preferable because of having superior reactivity.

The reason to determine the mixing ratio of epoxy resin/synthetic rubber/phenolic resin as (15–40)/(40–60)/(20–40) by weight is that the insulation resistance of the adhesive layer after hardening becomes at most $10^{13}$ Ω when the epoxy resin of less than 15 parts by weight is used, and that using the epoxy resin of more than 40 parts by weight makes it difficult to perform chemical roughening and causes swelling in the plating film at electroless plating and lowers peeling strength at most 1.3 kg/cm.

Using the synthetic rubber of less an 40 parts by weight makes it difficult to perform chemical roughening and causes swelling of the plating film and lowering peeling strength. On the contrary, using the synthetic rubber of more than 60 parts by weight has a tendency to lower the insulation resistance of the hardened adhesive layer to less than $10^{11}$ Ω especially in a case using a synthetic rubber containing acrylonitrile group.

Using the phenolic resin of less than 20 parts by weight causes insufficient reactivity with the synthetic rubber and swelling easily in the adhesive layer at the electroless plating. Using the phenolic resin of more than 40 parts by weight causes excess reaction with the synthetic rubber and makes it difficult to perform chemical roughening.

As for the photosensitive aromatic onium salt, aromatic onium salts of VII group element as disclosed in JP-B-52-14277 (1977), aromatic onium salts of VIa group elements as disclosed in JP-B-52-14278 (1977), and aromatic onium salts of Va group elements as disclosed in JP-B-52-14279 (1977) are known, and any one of them is usable. Concretely saying, tetrafluoroboric acid salt of triphenylphenacyl phosphonium, tetrafluoroboric acid salt of diphenyl iodomium etc. are usable. At least one of the photosensitive aromatic onium salts described above of 0.2–5 parts by weight is mixed prefer to the total resin component of 100 parts by weight.

Using less than 0.2 parts by weight causes insufficient hardening of the epoxy resin and the insulation resistance of the adhesive layer is lowered to less than $10^{11}$ Ω, and increment to more than 5 parts by weight does not yield better results.

As for the inorganic filler having hydroxyl group, the following are usable: zinc hydroxide, aluminium hydroxide, antimony hydroxide, cadmium hydroxide, calcium hydroxide, chromium hydroxide, cobalt hydroxide, stannic hydroxide, strontium hydroxide, ferric hydroxide, copper hydroxide, lead hydroxide, nickel hydroxide, barium hydroxide, bismuth hydroxide, arsenic hydroxide, magnesium hydroxide, manganese hydroxide, lanthanum hydroxide etc.

But, in consideration of insulation characteristics of the adhesive layer after hardening, ease of roughening, peeling strength of the plated film, resistance against soldering heat, and no possibility to cause any pollution in handling, zinc hydroxide, antimony hydroxide, calcium hydroxide, cobalt hydroxide, barium hydroxide, and manganese hydroxide are preferable. At least one of the inorganic fillers described above of 3–20 parts by weight is mixed to the total resin component of 100 parts by weight.

Using less than 3 parts by weight causes insufficient acceleration of low temperature hardening (135°–150° C.) of the synthetic rubber and the phenolic resin, and increment to more than 20 parts by weight does not accelerate more.

Further, in the present invention, zinc oxide, magnesium oxide and cobalt oxide etc. can be used as a vulcanization accelerator of the synthetic rubber. And, silicon oxide powder having large particle surface area as a thixotropical agent, and fine powder fillers such as calcium carbonate, calcium silicate, and zirconium silicate which have an effect to make chemical roughening easy, can be used together.

The adhesive agent of the present invention is prepared by kneading using a conventional two-roll roller, a three-roll roller, a kneader a ball mill, and a sand mill.

In a case of roll-kneading, the adhesive agent is obtained by kneading the synthetic rubber, an inorganic filler having hydroxyl group, a vulcanization accelerator, and other additives with a roller first, and dilution of the mixture with proper solvent, and next, mixing of the epoxy resin, the hardening agent of the epoxy resin such as photosensitive aromatic onium salt, and the phenolic resin into the mixture. A case using a kneader is the same as the case using the roller. In a case using a ball mill or a sand mill, a mixture of the epoxy resin, the synthetic rubber, the phenolic resin, and the photosensitive aromatic onium salt which are dissolved into the solvent preliminarily is kneaded after adding of the inorganic filler having hydroxyl group, the vulcanization accelerator, and other additives.

The solvent can be selected from ketone group, cellosolve group and other groups depending on the object, and it is preferable to adjust the solution to contain a solid fraction of 10–50% by weight.

As for a process to apply the adhesive agent on the surface of the insulating substrate, a conventional process such as a roll printing process, curtain coat process, dipping process, screen printing process etc. are used. In the case, thickness of the application can be adjusted with both of concentration of the adhesive agent in the solution and the method of application, and preferable thickness of the adhesive layer after drying is 10–100 μm.

When thinner than 10 μm, peeling strength and resistance against soldering heat of the electroless plating film which is formed on the adhesive layer becomes insufficient, and when thicker than 100 μm, a concern is caused that the irradiated ultraviolet ray does not reach to the bottom portion of the adhesive layer.

An adhesive film for forming an adhesive layer on a substrate for electroless plating (called adhesive film hereinafter) is prepared by applying the adhesive agent on a base film which is treated for releasing. The adhesive film is adhered to the insulating substrate with the base film by the surface whereon the adhesive agent is applied, and is stripped off of the base film after hardening treatment is performed, and superior ease of working is achieved at mass production of the printed circuit board at a factory. The adhesive film can be prepared by the following steps.

After kneading the resin composition thoroughly, the resin composition is dissolved and dispersed into an organic solvent with adding the photosensitive aromatic onium salt, and the adhesive agent solution is filtered and adjusted to contain solid fraction of 10–40% by weight. The adhesive film is prepared by applying the solution onto a surface of the transparent base film (film thickness 10–100 μm), of which surface is treated for releasing, by knife coat process or applicator process so as to make the film thickness after drying become an aimed thickness, and drying the film at 60°–110° C. for 5–20 minutes. Further, it is preferable to keep the organic solvent in an amount of 0.001–0.5% by weight in the adhesive agent layer of the adhesive film. The reason to keep the organic solvent is that the solvent is necessary in tentative sticking process of the adhesive film to the insulating substrate by an automatic sticking. And the range of content of the solvent described above is preferable because that the tentative sticking ease becomes worse when the content of the remaining solvent is too small and the solvent causes foaming in the adhesive layer when the content of the remaining solvent is too much.

As for the base film of the adhesive film, conventional transparent films can be used. Especially polyester film is superior in transparency and flatness, and is able to be treated effectively with a releasing agent which makes stripping off easy of the unnecessary base film after forming of an adhesive layer on the insulating substrate. Moreover, the polyester film is superior in heat resistance and, hence, in ease of the work of adhesive agent application. The preferable thickness of the polyester film is 10–100 μm in consideration of film tension at the application work and efficiency of ultraviolet ray irradiation for hardening of the adhesive agent etc.

As for the releasing agent which is used in releasing treatment of the base film, conventional releasing agents are used. But, it is important to use the agent which does not yield interference fringes by the irradiated ultraviolet ray. Silicone group releasing agent is well known as the releasing agent, but the silicone group releasing agent is not preferable because the agent easily yields interference fringes which causes heterogeneous hardening of the adhesive layer, and consequently, spoiling of uniformity in quality of the adhesive layer.

According to the investigation by the inventors, silylisocyanate group releasing agent is preferable as the releasing agent which is difficult to generate the interference fringes. The reason that the silylisocyanate group releasing agent does not cause the interference fringes is thought that the agent fits well on the surface of the base film and forms an optically homogeneous thin film of the releasing agent layer.

And, thickness of the releasing agent layer is preferably at most 0.1 μm to avoid effect of the releasing agent on the characteristics of the adhesive layer by transcription or transferring of the releasing agent to the adhesive agent.

The adhesive film which is prepared by the process described above is preferably provided with a protective coating, which is thin and has a property to be peeled off easily in order to be peeled off easily at usage, on the surface of the adhesive agent layer for prevention of secondary adhesion of the adhesive film to the reverse surface of the base film by winding, and for prevention of sticking of dust etc. and contamination of the surface of the adhesive layer.

The adhesive agent which is applied or adhered to the insulating substrate is hardened by heating or irradiation of ultraviolet ray at 135°–150° C. for 20–30 minutes. When the method to use the adhesive film is adopted, the hardening by heating is preferably performed after irradiation of the ultraviolet rays and peeling off the base film. If the hardening by heating is performed with the adhesive agent adhered to the base film, there is a possibility to cause foaming of the adhesive layer by reaction product (water etc.) of the synthetic rubber and the phenolic resin.

The surface of the hardened adhesive layer is roughened by using a conventional agent such as chromic acid mixture, and has added thereto a catalyst for electroless plating reaction and treated for activation, and is coated with plating resist except for a circuit pattern portion. Subsequently, a conductive circuit is formed by deposition of plating on the circuit pattern portion by electroless plating.

The reason that the adhesive agent of the present invention can be hardened at relatively low temperature such as 135°–150° C. exists in the inorganic filler having hydroxyl group. And the reason is thought that the inorganic filler releases the hydroxyl group at a relatively low temperature (at highest 150° C.), and effect of the hydroxyl group contributing to enhance a crosslinking reaction between an α carbon which is adjacent to a double bond portion of the synthetic rubber and methylol group in the phenolic resin.

Further, when photosensitive aromatic onium salt is used for hardening agent of the epoxy resin, the hardening can be carried out somewhat by the irradiation of ultraviolet ray and hence change in dimension of the adhesive agent at hardening can be depressed, and accordingly, it is thought that yielding of warp and distortion even at the insulating substrate having thickness of less than 1 mm is difficult.

Low hardening temperature means less thermal deterioration even in using a paper phenolic laminate board and difficulty in causing cracks between through holes and between perforated holes which are fabricated by press punching and in generating of defects of worm-eaten pattern at cutting section.

The adhesive agent for the substrate of electroless plating of the present invention does not generate warp nor distortion at the insulating substrate to which the adhesive agent is applied; therefore, printing of resist ink for the electroless plating and sticking of dry film type resist is easy, and formation of a fine conductive circuit is possible.

Especially, hardening temperature of the adhesive agent is low and thermal deterioration is small even if paper phenolic laminate board is used, and generation of cracks etc. between through holes which are fabricated by press punching and between perforated holes and of defects of worm-eaten pattern at cutting section is scarce.

Further, insulation resistance of the adhesive layer after hardening shows at least $10^{14}$ Ω, and peeling strength of the plating film is at least 2 kgf/cm, and resistance against soldering heat at 260° C. of the paper phenolic laminate board and the glass epoxy laminate board are at least 10 seconds and at least 180 seconds respectively. Moreover, insulation resistance between circuits is also preferable, and consequently the printed circuit board of superior quality can be obtained.

Therefore, use of thin substrate (thickness 0.1 mm) becomes possible, and high densification of a multilayer printed circuit board can be achieved. Further, as generation of warp and distortion does not occur, preciseness of mounting of tip members is improved and period of correcting process of the mounting members can be shortened.

And, as the adhesive agent of the present invention can be hardened at a low temperature in a short period, the adhesive agent is also effective as the adhesive agent for a flexible printed circuit board.

DESCRIPTION OF THE PREFERRED EMBODIMENTS

Embodiments of the present invention is explained hereinafter.

Embodiments 1-8

Composition of adhesive agents which were used in the embodiments are shown in table 1.

The adhesive agents were kneaded by a 2-roll roller and adjusted with addition of solvent to contain solid component of about 30% by weight.

Each of the adhesive agents was applied to surface of both of a paper phenolic laminate board (PP6F; made by Hitachi Kasei Kogyo: LP-461F) having 500 mm×500 mm×0.8 mm of thickness and a glass epoxy laminate board which was opaque to ultraviolet ray (GE4F; made by Sumitomo bakelite: EL-3762) having 0.5 mm of thickness by roll coat method so as to obtain an adhesive layer having about 30 μm of thickness after drying, and dried at 80° C. for 20 minutes.

Subsequently, the adhesive layer was irradiated with ultraviolet ray of 1.27 J/cm² by 365 nm sensor using a ultraviolet ray irradiator (made by Ohku Seisakusho: type HMW-514) which was provided with two high voltage mercury lamps of 80 W/cm having a reflector of parallel ray irradiator type which was able to irradiate both of ultraviolet ray and infrared ray concurrently. Surface temperature of the adhesive layer at the irradiation was 135° C.

Next, the adhesive layer was hardened at the designated temperature, and after being cooled down to the room temperature, each of the substrate was evaluated on warp, distortion, and defect of worm-eaten pattern of paper phenolic laminate board after plating at cutting section of press punching. The result is shown in table 2.

The distortion is indicated with distance (mm) from surface of a mirror plate, whereon an end of the board of 500 mm×500 mm was contacted, to the other end of the substrate in the air.

Figure 2:
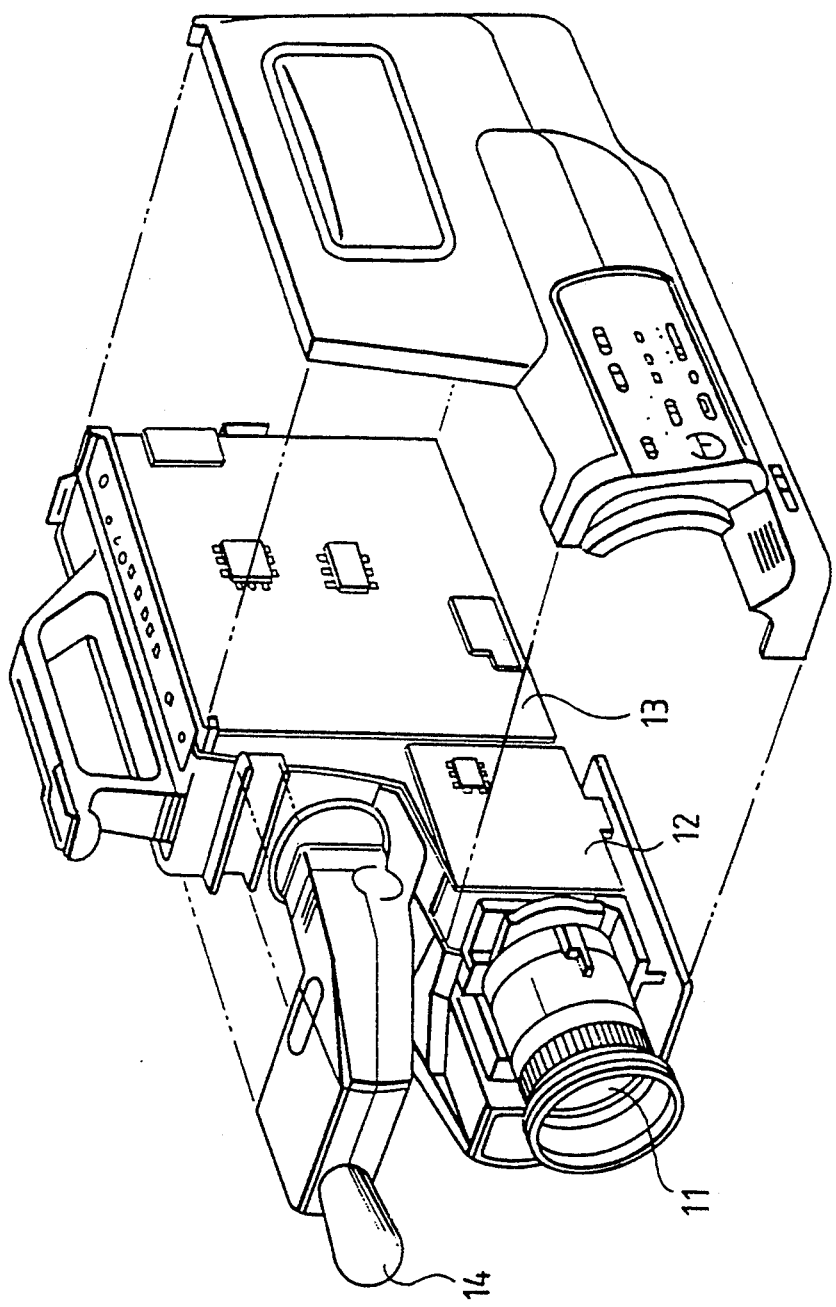
FIG. 2 is a perspective view of a partially disassembled camera mounting video tape recorder using the printed circuit board of the present invention.

Insulation resistance of the adhesive agent was measured on specimen which was prepared by the method based on FIG. 2 of JIS Z3197. A glass epoxy laminate board having copper foil of 35 μm thick was used and a comb shaped electrode was prepared by etching of the copper foil. Each of adhesive agents which were obtained by the embodiments was applied to the surface of the board whereon the comb shaped electrode was formed; and then drying, irradiation of ultraviolet ray and infrared ray, and hardening by heating were performed as same as described above. Insulation resistance of DC 500 V, 1 minute at initial stage and after humidification (40° C., 95% RH, 240 hours) was measured on each of the specimens. The result is shown in table 3.

Each of the specimens which was used for evaluation of warp and distortion was roughened in chemical roughening solution, which was prepared by adding 65 g. of chromic anhydride and 250 ml. of concentrated sulfuric acid to water to make 1 liter of the solution, at 50° C. for 7 minutes and washed with water; subsequently, washing treatment with hot water of 50° C. was performed for 10 minutes. Next, the specimen was treated in NaOH 6 g/l solution at 50° C. for about 10 minutes in order to remove roughened residuals on the surface. After washing again with water, the specimen was added with a catalyst for plating by being immersed into catalyst solution (made by Hitachi Kasei Kogyo: HS101B) which contained palladium, a catalyst for electroless plating reaction, for about 2 minutes. After washing with water, the specimen was immersed into activation solution, which was prepared by adding 1 g. of oxalic acid and 10 ml. of 36% hydrochloric acid to water to make 1 liter of the solution, for about 5 minutes, and then was washed with water again. Each of specimens which had been treated with pretreatment for plating as described above was dried at 120° C. for 10 minutes.

In order to form (1) a pattern for measurement of peeling strength of 1 cm wide and 10 cm long, (2) a pattern for measurement of resistance against soldering heat at 260° C. of 2.5 cm wide and 2.5 cm long, and (3) a pattern for measurement of insulation resistance between circuits having a comb shaped pattern (A) of 0.2 mm wide, 0.2 mm of interval and 1 m of facing length, and a comb shaped pattern (B) of 0.1 mm wide, 0.1 mm of interval and 1 m of facing length, the surface of the specimen was coated except for a necessary portion of the patterns with plating resist by screen printing process and photographic process.

In the screen printing process, the portion other than the pattern forming portion was screen printed with ultraviolet hardening type plating resist ink (made by Nippon Soda: RI-510), and the ink was hardened by irradiation of ultraviolet ray of 1.5 J/cm$^2$. In the photographic process, dry film type plating resist (made by Hitachi Kasei Kogyo: SR3200) was adhered to the surface of the specimen, and the surface portion other than the pattern forming portion was exposed to light of 300 mJ/cm$^2$, subsequently, the plating resist of unexposed portion (pattern forming portion) was developed and eliminated.

Next, the specimen was plated with electroless copper plating solution having following composition at 70° C. for about 5 hours to form a copper plating film 30 μm thick on the surface of the pattern forming portion. After the plating, the specimen was washed with water and dried at 150° C. for 30 minutes

| | |
|---|---|
| Copper sulfate | 10 g. |
| Ethylenediaminetetraacetic acid disodium dihydrate salt | 30 g. |
| 37% formalin aqueous solution | 3 ml. |
| Germanium dioxide | 70 mg. |
| Polyethylene glycol (molecular weight 1000) | 1 g. |
| Sodium hydroxide | a quantity to make the pH of the plating solution 12.6 (at 25° C.) |
| Water | a quantity to make the solution 1 liter |

After the plating, the peeling strength and the resistance against soldering heat were measured on each of the specimens by a method based on JIS C6481.

And, initial value and value after humidification (40° C., 95% RH after 240 hours) of the insulation resistance were measured. The result of the measurement are shown in table 4 and 5.

TABLE 1

| Composition | Commercial name | Manufacturer | Embodiment (parts by weight) | | | | | | | |
|---|---|---|---|---|---|---|---|---|---|---|
| | | | 1 | 2 | 3 | 4 | 5 | 6 | 7 | 8 |
| Bisphenol A type epoxy resin | | | | | | | | | | |
| Epoxy equivalent (g/eq) | | | | | | | | | | |
| 450~500 | UVR-6510 | Union Carbide Japan | 15 | 20 | 30 | 40 | 20 | 20 | 10 | — |
| 900~1000 | YD-014 | Tohto Kasei | — | — | — | — | — | — | 10 | 15 |
| Synthetic rubber | | | | | | | | | | |
| Acrylonitrile butadiene rubber | Nipol-1042 | Nippon Zeon | — | — | — | 40 | — | 45 | — | — |
| | Nipol-1032 | Nippon Zeon | — | 50 | 45 | — | — | — | — | — |
| | DN-400 | Nippon Zeon | 60 | — | — | — | — | — | 45 | — |
| Acrylonitrile butadiene rubber containing isoprene | DN-1201 | Nippon Zeon | — | — | — | — | 50 | — | — | 40 |
| Acrylonitrile butadiene rubber containing carboxyl | Nipol-1072J | Nippon Zeon | — | — | — | — | — | 5 | — | — |
| Stylene butadiene rubber | Nipol-1502 | Nippon Zeon | — | — | — | — | — | — | 5 | 5 |
| Rosol type phenolic resin | | | | | | | | | | |
| Alkyl denatured phenolic resin | H-2503 | Hitachi Kasei Kogyo | 10 | — | 5 | 20 | 10 | 5 | 20 | 10 |
| | H-2400 | Hitachi Kasei Kogyo | 15 | 30 | 20 | — | 20 | 25 | 10 | 30 |
| Photosensitive aromatic onium salt | | | | | | | | | | |
| Hexafluoroantimonic acid triphenyl sulfonium | UVI-6974 | Union Carbide Japan | 0.2 | 1.0 | 2.5 | 5.0 | 1.5 | 1.5 | 2.0 | 2.0 |
| Inorganic filler having hydroxyl group | | | | | | | | | | |
| Zinc hydroxide | — | Kanto Kagaku | — | — | — | — | 5 | 20 | — | — |
| Calcium hydroxide | — | Wako Jyunyaku Kogyo | 3 | 10 | 10 | 10 | 10 | — | 10 | — |
| Magnesium hydroxide | — | Wako Jyunyaku Kogyo | — | — | — | 5 | — | — | — | 20 |
| Vulcanization accelerator | | | | | | | | | | |
| Zinc oxide | Fine zinc flower | Sakai Kagaku Kogyo | 5 | 10 | — | 5 | 5 | 10 | — | 10 |
| Magnesium oxide | Kyowa mag 150 | Kyowa Kagaku Kogyo | — | — | 10 | — | 5 | — | 10 | — |
| Inorganic filler | | | | | | | | | | |
| Silicone oxide | Nipsil E220A | Nippon Silica Kogyo | 2 | 2 | 2 | 2 | 2 | 2 | 2 | 2 |
| Zirconium silicate | Micropaks SS | Hakusui Kagaku Kogyo | 10 | 15 | 10 | 15 | 20 | 5 | 10 | 10 |
| Calcium silicate | Fine seal SP-10F | Tokuyama Soda | — | — | 10 | 10 | — | 10 | 10 | 10 |
| Solvent | | | | | | | | | | |
| Methylethylketone | — | Wako Jyunyaku Kogyo | 280 | 322 | 337 | 354 | 347 | 347 | 336 | 359 |

TABLE 2

| Insulating substrate | Hardening condition (heating) | Evaluation | Embodiment (mm) | | | | | | | |
|---|---|---|---|---|---|---|---|---|---|---|
| | | | 1 | 2 | 3 | 4 | 5 | 6 | 7 | 8 |
| Paper phenolic laminate board | 140° C. 20 minutes 150° C. 30 minutes | Warp | 0.7 | 0.6 | 0.7 | 0.7 | 0.6 | 0.6 | 0.6 | 0.6 |
| | | Distortion | 0.2 | 0.3 | 0.2 | 0.2 | 0.3 | 0.2 | 0.3 | 0.2 |
| | | Warp | 0.6 | 0.6 | 0.7 | 0.6 | 0.7 | 0.7 | 0.6 | 0.5 |
| | | Distortion | 0.3 | 0.2 | 0.3 | 0.3 | 0.3 | 0.2 | 0.2 | 0.3 |
| Glass epoxy laminate | 140° C. 20 minutes 150° C. | Warp | 0.6 | 0.5 | 0.4 | 0.5 | 0.5 | 0.4 | 0.4 | 0.5 |
| | | Distortion | 0.4 | 0.5 | 0.4 | 0.4 | 0.4 | 0.5 | 0.5 | 0.4 |
| | | Warp | 0.6 | 0.6 | 0.5 | 0.6 | 0.5 | 0.5 | 0.5 | 0.6 |

TABLE 2-continued

| Insulating substrate board | Hardening condition (heating) | Evaluation | Embodiment (mm) | | | | | | | |
|---|---|---|---|---|---|---|---|---|---|---|
| | | | 1 | 2 | 3 | 4 | 5 | 6 | 7 | 8 |
| | 30 minutes | Distortion | 0.4 | 0.4 | 0.5 | 0.4 | 0.4 | 0.5 | 0.4 | 0.5 |

TABLE 3

| Hardening condition (heating) | Measurement | Embodiment ($\times 10^{14}$ Ω) | | | | | | | |
|---|---|---|---|---|---|---|---|---|---|
| | | 1 | 2 | 3 | 4 | 5 | 6 | 7 | 8 |
| 140° C. 20 minutes | Initial value | 1.2 | 3.6 | 4.8 | 3.9 | 3.2 | 7.8 | 7.7 | 7.7 |
| | Humid value | 0.8 | 2.8 | 3.1 | 3.6 | 2.4 | 5.5 | 5.6 | 6.3 |
| 150° C. | Initial value | 2.7 | 4.9 | 6.9 | 5.9 | 4.4 | 8.8 | 7.9 | 8.9 |
| 30 minutes | Humid value | 1.3 | 4.0 | 4.5 | 5.7 | 2.1 | 6.7 | 7.0 | 7.4 |

TABLE 4

(Substrate: Paper phenolic laminate board)

| Hardening condition | Plating resist | Evaluation | Embodiment | | | | | | | |
|---|---|---|---|---|---|---|---|---|---|---|
| | | | 1 | 2 | 3 | 4 | 5 | 6 | 7 | 8 |
| 140° C. 20 minutes | Ink | Peeling strength (kgf/cm) | 2.0 | 2.2 | 2.6 | 2.3 | 2.3 | 2.0 | 2.1 | 2.0 |
| | | Resistance against soldering heat (second) | 31 | 28 | 25 | 32 | 29 | 36 | 32 | 34 |
| | | Insulation resistance (A) ($\times 10^{10}$ Ω) | | | | | | | | |
| | | Initial value | 240 | 330 | 310 | 290 | 530 | 620 | 780 | 310 |
| | | Humid value | 6.1 | 7.9 | 5.9 | 7.4 | 8.8 | 1.3 | 2.1 | 6.8 |
| | Dry film | Peeling strength (kgf/cm) | 2.2 | 2.2 | 2.5 | 2.8 | 2.2 | 2.3 | 2.0 | 2.0 |
| | | Resistance against soldering heat (second) | 32 | 30 | 29 | 30 | | | | |
| | | Insulation resistance (B) ($\times 10^{10}$ Ω) | | | | | | | | |
| | | Initial value | 230 | 240 | 320 | 340 | 600 | 590 | 290 | 460 |
| | | Humid value | 5.0 | 4.4 | 2.6 | 5.1 | 2.2 | 2.7 | 4.9 | 5.4 |
| 150° C. 30 minutes | Ink | Peeling strength (kgf/cm) | 2.1 | 2.2 | 2.4 | 2.2 | 2.3 | 2.0 | 2.0 | 2.1 |
| | | Resistance against soldering heat (second) | 24 | 29 | 30 | 31 | 29 | 24 | 34 | 22 |
| | | Insulation resistance (A) ($\times 10^{10}$ Ω) | | | | | | | | |
| | | Initial value | 120 | 620 | 490 | 380 | 630 | 700 | 320 | 220 |
| | | Humid value | 4.0 | 3.7 | 6.0 | 6.9 | 7.2 | 4.8 | 4.8 | 5.5 |
| | Dry film | Peeling strength (kgf/cm) | 2.1 | 2.2 | 2.1 | 2.3 | 2.0 | 2.0 | 2.1 | 2.0 |
| | | Resistance against soldering heat (second) | 30 | 32 | 25 | 27 | 23 | 38 | 32 | 23 |
| | | Insulation resistance (B) ($\times 10^{10}$ Ω) | | | | | | | | |
| | | Initial value | 120 | 320 | 420 | 410 | 660 | 690 | 380 | 480 |
| | | Humid value | 4.1 | 5.6 | 4.9 | 7.8 | 3.9 | 4.4 | 5.1 | 6.3 |

TABLE 5

(Substrate: Glass epoxy laminate board)

| Hardening condition | Plating resist | Evaluation | Embodiment | | | | | | | |
|---|---|---|---|---|---|---|---|---|---|---|
| | | | 1 | 2 | 3 | 4 | 5 | 6 | 7 | 8 |
| 140° C. 20 minutes | Ink | Peeling strength (kgf/cm) | 2.1 | 2.3 | 2.4 | 2.4 | 2.5 | 2.1 | 2.0 | 2.0 |
| | | Resistance against soldering heat (second) | >180 | >180 | >180 | >180 | >180 | >180 | >180 | >180 |
| | | Insulation resistance (A) ($\times 10^{10}$ Ω) | | | | | | | | |
| | | Initial value | 500 | 630 | 710 | 680 | 830 | 770 | 710 | 820 |
| | | Humid value | 12 | 78 | 54 | 44 | 66 | 70 | 55 | 56 |
| | Dry film | Peeling strength (kgf/cm) | 2.1 | 2.2 | 2.3 | 2.3 | 2.3 | 2.1 | 2.1 | 2.0 |
| | | Resistance against soldering heat (second) | >180 | >180 | >180 | >180 | >180 | >180 | >180 | >180 |
| | | Insulation resistance (B) ($\times 10^{10}$ Ω) | | | | | | | | |
| | | Initial value | 470 | 500 | 700 | 540 | 620 | 710 | 680 | 800 |
| | | Humid value | 10 | 60 | 54 | 40 | 37 | 44 | 29 | 42 |
| 150° C. 30 minutes | Ink | Peeling strength (kgf/cm) | 2.0 | 2.3 | 2.2 | 2.4 | 2.1 | 2.1 | 2.1 | 2.0 |
| | | Resistance against soldering heat (second) | >180 | >180 | >180 | >180 | >180 | >180 | >180 | >180 |
| | | Insulation resistance (A) ($\times 10^{10}$ Ω) | | | | | | | | |
| | | Initial value | 660 | 1300 | 2000 | 2800 | 1900 | 2800 | 2900 | 2400 |
| | | Humid value | 32 | 41 | 68 | 100 | 780 | 210 | 330 | 290 |
| | Dry film | Peeling strength (kgf/cm) | 2.0 | 2.1 | 2.3 | 2.1 | 2.2 | 2.0 | 2.0 | 2.0 |
| | | Resistance against soldering heat (second) | >180 | >180 | >180 | >180 | >180 | >180 | >180 | >180 |
| | | Insulation resistance (B) ($\times 10^{10}$ Ω) | | | | | | | | |
| | | Initial value | 560 | 890 | 430 | 780 | 630 | 770 | 700 | 650 |
| | | Humid value | 48 | 67 | 60 | 54 | 55 | 69 | 30 | 100 |

As shown in table 2, both of warp and distortion of the adhesive agents of the embodiment 1–8 are less than 1 mm irrespective of sort of the substrate. Press punching was performed after the plating in a case using the paper phenolic laminate board, but generation of the defect of worm-eaten pattern at the cutting section and of cracks between through holes and perforated holes were not observed. And, as shown in table 3, the hardened film of the adhesive agents of the embodiment 1–8 had initial values of at least $10^{14}$ Ω, and humid values of $10^{13}$–$10^{14}$ Ω.

Further, as shown in table 4 and 5, the peeling strength of all specimens were at least 2 kgf/cm, and resistance against soldering heat at 260° C. were at least 20 seconds (time elapsed before swelling of the substrate was initiated) with the paper phenolic laminate board and at least 180 seconds with the glass epoxy laminate board.

The initial values of insulation resistance between comb shaped pattern (A) which was formed by the screen printing process and comb shaped pattern (B) which was formed by the photographic process were $10^{12}$ Ω in all cases. And humid values were at least $10^{10}$ Ω in the case using paper phenolic laminate board and $10^{11}$–$10^{12}$ Ω in the case using glass epoxy laminate board.

Comparative Example 1–8

Adhesive agents were prepared with the same raw materials as the adhesive agents in the embodiments 1–8 shown in table 1 except using trifluoroboron monomethylamine instead of the photosensitive aromatic onium salt and mixing no inorganic filler having hydroxyl group. The adhesive agents described above were applied to the insulation substrate and dried, and subsequently hardened at 160° C. for 60 minutes.

As the result, warp and distortion of 2.1–3.8 mm were generated with the insulating substrate. Therefore, difficulty in screen printing and sticking of dry film resist was caused, and evaluation of insulation resistance between circuits was not performed as formation of a fine circuit was impossible.

Additionally, the insulation resistance of the hardened film of the adhesive agents was $10^{13}$ Ω as of the initial value.

The peeling strength and the resistance against soldering heat which were measured on the specimens of whole plated substrates indicated almost the same values as the embodiments 1–8. In the press punching which was performed on the specimen using the paper phenolic laminate board after plating, the defect of worm-eaten pattern on the cutting section and the cracks between through holes and perforated holes were generated.

Embodiment 9

An adhesive agent, which was prepared with the same raw materials as the embodiment 3 except using 1.5 parts by weight of 2-ethyl-4-methylimidazole (made by Shikoku Kasei) instead of hexafluoroantimonic acid triphenylsulfonium, was applied on a surface of the paper phenolic laminate board and on a surface of the glass epoxy laminate board so as to make the thickness about 30 μm after drying by roll coating; and, after drying at 80° C. for 20 minutes, hardening by heating was performed at 140° C. for 20 minutes and at 150° C. for 30 minutes.

After being cooled to room temperature warp and distortion were measured. The result was shown in table 6. Generation of the defect of worm-eater pattern on the cutting section at the press punching of the paper phenolic laminate board after electroless plating was not observed.

The insulation resistance of the adhesive agent layer by comb shaped electrode, peeling strength, resistance against soldering heat, and insulation resistance between circuits were measured in the same way as in embodiment 1, and the results are shown in table 7, 8 and 9.

TABLE 6

| Insulating substrate | Hardening condition | Result | |
|---|---|---|---|
| Paper phenolic laminate board | 140° C. 20 minutes | Warp | 0.7 mm |
| | | Distortion | 0.3 mm |
| | 150° C. 30 minutes | Warp | 0.6 mm |
| | | Distortion | 0.3 mm |
| Glass epoxy Laminate board | 140° C. 20 minutes | Warp | 0.4 mm |
| | | Distortion | 0.4 mm |
| | 150° C. 30 minutes | Warp | 0.5 mm |
| | | Distortion | 0.4 mm |

TABLE 7

| Insulating substrate | Hardening condition | Result (× $10^{14}$ Ω) | |
|---|---|---|---|
| Comb shaped circuit formed with copper plated glass epoxy laminate board | 140° C. 20 minutes | Initial value | 5.6 |
| | | Humid value | 3.2 |
| | 150° C. 30 minutes | Initial value | 7.8 |
| | | Humid value | 4.1 |

TABLE 8

| Substrate | Hardening condition | Plating resist | Evaluation | | Result |
|---|---|---|---|---|---|
| Paper phenolic laminate board | 140° C. 20 minutes | Ink | Peeling strength (kgf/cm) | | 2.5 |
| | | | Resistance against soldering heat (seconds) | | 23 |
| | | | Insulation resistance (A) (× $10^{10}$ Ω) | Initial value | 440 |
| | | | | Humid value | 6.0 |
| | | Dry film | Peeling strength (kgf/cm) | | 2.6 |
| | | | Resistance against soldering heat (seconds) | | 21 |
| | | | Insulation resistance (B) (× $10^{10}$ Ω) | Initial value | 380 |
| | | | | Humid value | 5.3 |
| | 150° C. 30 minutes | Ink | Peeling strength (kgf/cm) | | 2.4 |
| | | | Resistance against soldering heat (seconds) | | 27 |
| | | | Insulation resistance (A) (× $10^{10}$ Ω) | Initial value | 660 |
| | | | | Humid value | 7.1 |
| | | Dry film | Peeling strength (kgf/cm) | | 2.4 |
| | | | Resistance against soldering heat (seconds) | | 24 |
| | | | Insulation resistance | Initial value | 570 |

TABLE 8-continued

| Substrate | Hardening condition | Plating resist | Evaluation | | Result |
|---|---|---|---|---|---|
| | | | (B) ($\times 10^{10}$ Ω) | Humid value | 3.8 |

TABLE 9

| Substrate | Hardening condition | Plating resist | Evaluation | | Result |
|---|---|---|---|---|---|
| Glass epoxy laminate board | 140° C. 20 minutes | Ink | Peeling strength (kgf/cm) | | 2.3 |
| | | | Resistance against soldering heat (seconds) | | >180 |
| | | | Insulation resistance (A) ($\times 10^{10}$ Ω) | Initial value | 820 |
| | | | | Humid value | 60 |
| | | Dry film | Peeling strength (kgf/cm) | | 2.4 |
| | | | Resistance against soldering heat (seconds) | | >180 |
| | | | Insulation resistance (B) ($\times 10^{10}$ Ω) | Initial value | 770 |
| | | | | Humid value | 62 |
| | 150° C. 30 minutes | Ink | Peeling strength (kgf/cm) | | 2.4 |
| | | | Resistance against soldering heat (seconds) | | >180 |
| | | | Insulation resistance (A) ($\times 10^{10}$ Ω) | Initial value | 3100 |
| | | | | Humid value | 79 |
| | | Dry film | Peeling strength (kgf/cm) | | 2.3 |
| | | | Resistance against soldering heat (seconds) | | >180 |
| | | | Insulation resistance (B) ($\times 10^{10}$ Ω) | Initial value | 2100 |
| | | | | Humid value | 88 |

Embodiment 10-13

Four kinds of adhesive agents shown in table 10 were prepared.

Synthetic rubber, vulcanization accelerator, and inorganic filler having hydroxyl group were kneaded preliminarily by a pressurized kneaded, and subsequently, the mixture was kneaded by a 2-roll roller and diluted with methylethylketone (MEK).

On the other hand, epoxy resin, reson type phenolic resin, and photosensitive aromatic onium salt were dissolved in MEK. Both of the solutions described above were mixed together and filtered with a filter having a pore size of 25 μm, and an adhesive agent containing solid component of 30% by weight was prepared.

Using a polyester film of 38 μm thick as a base film, of which surface was treated with silylisocyanate group releasing agent, the adhesive agent described above was applied on the treated surface of the base film by an applicator so as to obtain a film of which thickness after drying was 30 μm, and after drying under a condition described in table 10, an adhesive film was prepared by winding the base film with concurrent covering of the applied plane of the adhesive agent with a polyethylene protective film of 30 μm thick in cooled condition by blowing of chilled air. Additionally, a result of determination of residual quantity of MEK in the adhesive agent layer of the adhesive film by as chromatography is shown in table 10.

Next, surfaces of substrates, on which the adhesive layer was to be positioned, which were composed of paper or phenolic laminate board (made by Hitachi Kasei Kogyo: LP-416F) of 1 mm thick and glass epoxy laminate board (made by Hitachi Kasei Kogyo: opaque to ultraviolet ray, LE67N-W) of 1 mm thick, were blasted by 4 kg/cm² with grinding solution, in which volcanic ash of 50 parts by weight was dispersed, washed with water, and dried (80° C.) to form rough planes having average roughness of 3 μm.

Figure 1:
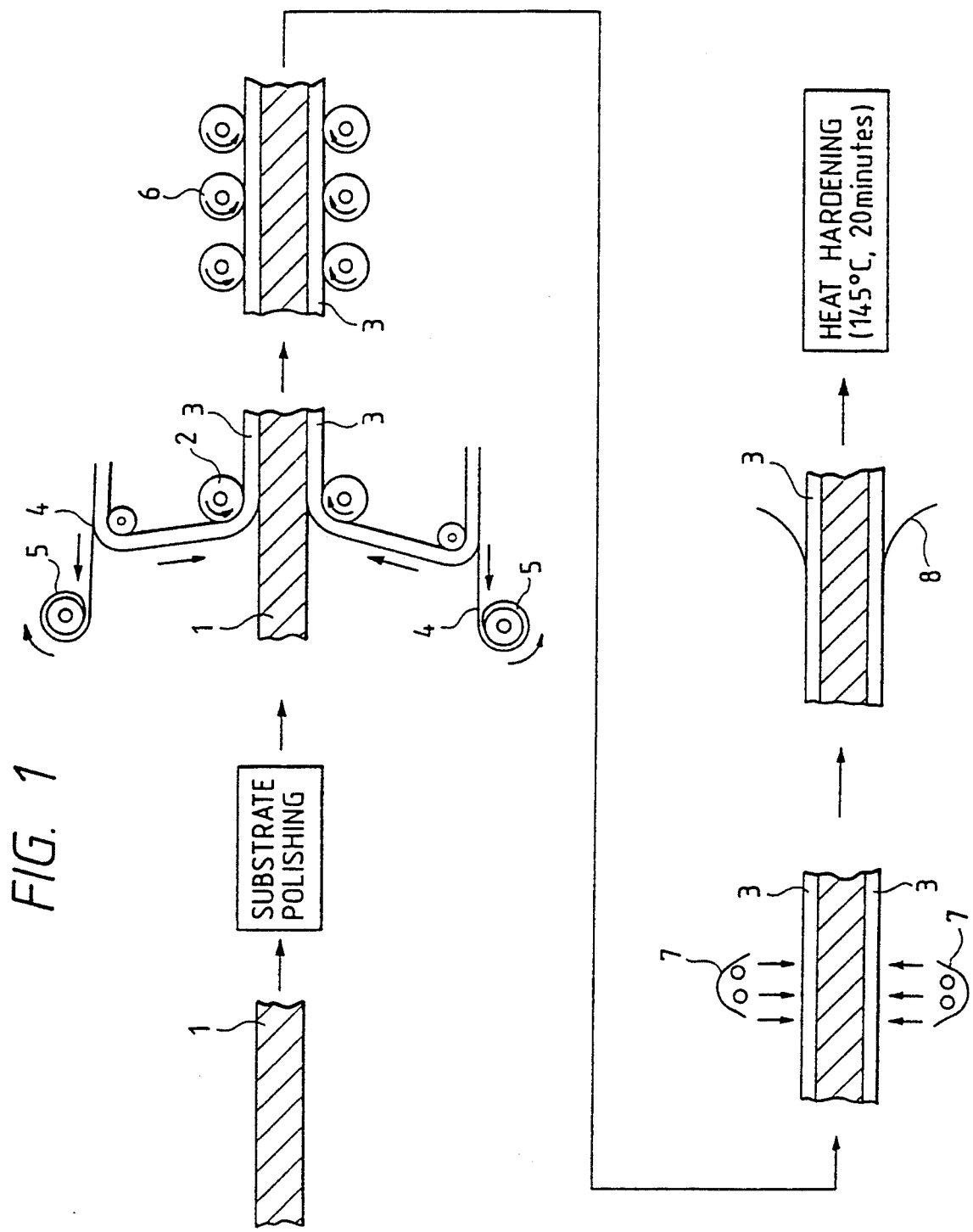
FIG. 1 is a flow diagram showing a production process of the adhesive layer for a substrate of electroless plating using the adhesive film.

As shown in FIG. 1, the adhesive agent plane 3 of the adhesive film was adhered temporarily to the surface of the substrate 1 by a hot roll laminator (made by Hitachi Kasei Kogyo: Type HLM-1500) with concurrent stripping off of the protective film 4 covering the adhesive agent 3 of the adhesive film and winding of the stripped protective film by a winding roll 5. The condition of the first step hot roll 2 at the temporary sticking was a surface temperature of 130° C., roll pressure of 4 kg/cm², and moving velocity of 1.5 m/minute.

After temporary sticking of the adhesive film, the substrate was passed through 3 pairs of the secondary rolls successively for adhesion. The condition of the secondary roll for adhesion was a surface temperature of 150° C., roll pressure of 4 kg/cm², and moving velocity of 1.5 m/minute.

Subsequently, irradiation of ultraviolet ray of 1.27 J/cm² by 365 nm sensor was performed at 135° C. of the surface temperature of the adhesive layer by an ultraviolet ray irradiator 7 (made by Ohku Seisakusho: Type HMW-514) having 2 high voltage mercury lamps of 80 W/cm with a parallel light irradiator type reflector which was able to irradiate both of ultraviolet ray and infrared ray concurrently from above the base film. In all cases, generation of swelling and wrinkling in the adhesive layer was not observed.

Next, the base film 8 of the adhesive film on the substrate 1 was stripped off by an autopeeler, and subsequently, the adhesive layer was hardened by heating at 145° C. for 20 minutes with passing through a conveyer type tunnel furnace.

In the adhesive layer which was formed on the surface of the substrate, any of void, swelling, and wrinkling were not observed, and any of residual MEK was not detected by gas chromatography.

TABLE 10

| Composition | | Commercial name | Manufacturer | Embodiment (parts by weight) | | | |
|---|---|---|---|---|---|---|---|
| | | | | 10 | 11 | 12 | 13 |
| Bisphenol A type eposy resin | Epoxy resin 450~500 equivalent | UVR-6510 | Union carbide Japan | 15 | 20 | 22 | 40 |
| Synthetic rubber | Acrylonitrile butadiene rubber | Nipol 1032 | Nippon Zeon | 55 | 50 | — | 40 |
| | Acrylonitrile butadiene rubber containing isoprene | DN-1201 | Nippon Zeon | — | — | 45 | — |
| | Acrylonitrile butadiene rubber containing carboxyl | Nipol-1072J | Nippon Zeon | 5 | — | — | — |
| Resol type phenolic resin | Alkyl denatured phenolic resin | H-2530 | Hitachi Kasei Kogyo | 25 | 30 | 38 | 20 |
| Photosensitive aromatic onium salt | Hexafluoroantimonic acid triphenyl phosphonium | UVI-6974 | Union carbide Japan | 1.5 | 2.0 | 2.5 | 4.0 |
| Inorganic filler containing hydroxyl group | Calcium hydroxide | — | Wako Jyunyaku Kogyo | 18 | 10 | 5 | 5 |
| Valcanization accelerator | Zinc oxide | Fine Zinc flower | Sakai Kagaku Kogyo | 5 | 5 | 4 | 4 |
| Inorganic filler | Silicone oxide | Nipsil E220A | Nihon Silica Kogyo | 2 | 2 | 2 | 2 |
| | Zirconium silicate | Micropaks SS | Hakusui Kagaku Kogyo | 10 | 10 | 10 | 10 |
| Solvent | Methylethylketone | — | Wako Jyunyaku Kogyo | 318.5 | 301 | 288.2 | 291.7 |
| Condition of drying | | | | 60° C./ 5 min. | 80° C./ 15 min. | 110° C./ 20 min. | 110° C./ 10 min. |
| Residual content of solvent after drying (% by weight) | | | | 0.26 | 0.054 | 0.0012 | 0.0023 |

TABLE 11

(Substrate: Paper phenolic laminate board)

| Drying condition after plating | Evaluation | | Embodiment | | | |
|---|---|---|---|---|---|---|
| | | | 10 | 11 | 12 | 13 |
| Room temperature | Peeling strength (kgf/cm) | | 2.8 | 2.6 | 2.5 | 2.5 |
| | Resistance against soldering heat (seconds) | | 13 | 16 | 18 | 15 |
| | Insulation resistance (B) ($\times 10^{10}$ Ω) | Initial value | 38 | 21 | 28 | 24 |
| | | Humid value | 5.1 | 7.3 | 7.0 | 6.1 |
| 80° C. 10 minutes | Peeling strength (kgf/cm) | | 3.1 | 2.8 | 2.6 | 2.5 |
| | Resistance against soldering heat (seconds) | | 20 | 25 | 22 | 23 |
| | Insulation resistance (B) ($\times 10^{10}$ Ω) | Initial value | 54 | 51 | 76 | 60 |
| | | Humid value | 5.0 | 7.1 | 6.8 | 4.4 |
| 140° C. 30 minutes | Peeling strength (kgf/cm) | | 2.8 | 3.2 | 3.4 | 3.0 |
| | Resistance against soldering heat (seconds) | | 24 | 39 | 32 | 38 |
| | Insulation resistance (B) ($\times 10^{10}$ Ω) | Initial value | 74 | 68 | 82 | 73 |
| | | Humid value | 6.1 | 6.0 | 11 | 12 |

TABLE 12

(Substrate: Glass epoxy laminate board)

| Drying condition after plating | Evaluation | | Embodiment | | | |
|---|---|---|---|---|---|---|
| | | | 10 | 11 | 12 | 13 |
| Room temperature | Peeling strength (kgf/cm) | | 2.7 | 3.6 | 3.2 | 3.2 |
| | Resistance against soldering heat (seconds) | | 185 | 287 | 250 | 302 |
| | Insulation resistance (B) ($\times 10^{10}$ Ω) | Initial value | 220 | 210 | 180 | 300 |
| | | Humid value | 71 | 66 | 98 | 61 |
| 80° C. 10 minutes | Peeling strength (kgf/cm) | | 3.1 | 3.1 | 3.4 | 3.2 |
| | Resistance against soldering heat (seconds) | | >600 | >600 | >600 | >600 |
| | Insulation resistance (B) ($\times 10^{10}$ Ω) | Initial value | 550 | 560 | 500 | 620 |
| | | Humid value | 99 | 80 | 120 | 88 |
| 140° C. 30 minutes | Peeling strength (kgf/cm) | | 3.0 | 3.2 | 3.6 | 3.3 |
| | Resistance against soldering heat (seconds) | | >600 | >600 | >600 | >600 |
| | Insulation resistance (B) ($\times 10^{10}$ Ω) | Initial value | 590 | 570 | 510 | 550 |
| | | Humid value | 130 | 290 | 180 | 200 |

The substrate on which the adhesive layer was formed was treated with chemical roughening, addition of plating catalyst and so on as same as the embodiment 1, and dried at 120° C. for 20 minutes.

Next, the substrate had adhered thereto a dry film type plating resist (made by Hitachi Kasei Kogyo: SR3200) for electroless plating, and was irradiated by ultraviolet ray except for the circuit pattern portion. The portion which was not exposed to the ultraviolet ray was removed by development.

As for the circuit pattern described above, the pattern for measurement of peeling strength of 1 cm wide and 10 cm long, the pattern for measurement of resistance against soldering heat at 260° C. of 2.5 cm wide and 2.5 cm long, and the pattern for measurement of insulation resistance between circuits having the shaped circuit pattern (B) of 0.1 mm wide, 0.1 mm of interval, and 1 m of facing length, were formed the same way as in the embodiment 1.

Subsequently, copper plated film of about 30 μm thick was formed on each of the pattern forming portions by plating at 70° C. for about 5 hours in the electroless plating solution having the same composition as the embodiment 1, and washed with water and dried. The peeling strength and the resistance against soldering heat were measured on the plate specimens.

The insulation resistance between circuits were measured on the initial value of DC 100 V×1 minute and the value after humidification (40° C., 95 RH, 240 hours). The results of the measurements are shown in tables 11 and 12.

On the peeling strength, the difference depending on the difference of drying condition after the plating was not observed as shown in the tables 11 and 12, and values at least 2.5 kg/cm were obtained and peeling at boundary with the substrate was not generated. Additionally, the resistance against soldering heat and the insulation resistance between circuits are improved by drying.

Next, in order to investigate effect of residual solvent in the adhesive agent after application on the base film, five kinds of specimens of which content of MEK was 0.0004, 0.0012, 0.04, 0.5, and 0.7% by weight respectively were prepared by changing the drying condition of the adhesive agent of the embodiment 10, and the first tentative adhesion was performed by the hot roll laminater the same way as in the embodiment 10.

The result revealed that the specimen containing 0.0004% by weight of the solvent was not preferable as an adhesive film for an autolaminater because the specimen was unable to adhere tentatively and only the substrate was transferred by the roll. Moreover, the specimen of 0.7 % by weight was superior in the tentative adhesion, but foaming in the adhesive layer was generated in the subsequent hardening process.

On the other hand, the foaming was not generated on the specimens of which content of the solvent were 0.0012, 0.04, and 0.5% by weight, and preferable tentative adhesiveness was observed.

FIG. 2 is a perspective view of a partially disassembled camera mounting video tape recorder using the printed circuit board of the present invention.

An image which was focused in a camera tube by a lens 11 is transferred photoelectrically and transmitted to an amplifier as video signal. The video signal which is amplified and transferred by the amplifier is recorded by using a recording head with audio signal which is collected by a microphone 14. One of obstacles for miniaturization of the camera mounting video tape recorder (VTR) was printed circuit boards 12, 13 for mounting of electric members in the amplifier.

By replacing the printed circuit boards with the printed circuit board of the present invention, reduction of thickness and area by about ½ is possible. Accordingly, size of the VTR can be reduced to about ¾ of size of a conventional VTR.

What is claimed is:

1. A substrate for printed circuit board, comprising an adhesive layer on a circuit forming plane, said adhesive layer being a cured resin produced by curing a composition comprising an epoxy resin, a synthetic rubber, and a phenol resin, the epoxy resin, the synthetic rubber and the phenol resin constituting three resin components of the composition, a vulcanizing agent, a photosensitive hardener which produces Lewis acid upon irradiation with ultraviolet rays, an inorganic filler powder having hydroxyl groups which release hydroxyl groups upon heating, and an organic solvent, wherein the composition has been cured by being irradiated with ultraviolet rays followed by heating until the composition is cured.

2. The substrate according to claim 1, wherein the composition further contains a vulcanization accelerator for the synthetic rubber.

3. The substrate according to claim 1, wherein the composition has curing characteristics represented by a curing temperature of 150° C. or lower within 30 minutes.

4. The substrate according to claim 1, wherein the inorganic filler powder releases hydroxyl groups at a temperature no higher than 150° C. so as to accelerate a reaction between the synthetic rubber and phenol resin.

5. The substrate according to claim 1, wherein the photosensitive hardener is an aromatic onium salt.

6. The substrate according to claim 1, wherein amounts of the epoxy resin, synthetic rubber and phenol resin are respectively (15–40), (40–60) and (20–40) in parts by weight, and an amount of the inorganic filler powder is at least 3 parts by weight based on 100 parts of the three resin components.

7. The substrate according to claim 1, wherein an amount of the hardener is 0.2 to 5 parts by weight based on 100 parts of the three resin components.

8. The substrate according to claim 1, wherein an amount of the solvent is 0.001 to 0.5% by weight per weight of the composition.

9. A substrate for printed circuit board, comprising an adhesive layer formed on a circuit forming plane by curing a composition which comprises an epoxy resin, a synthetic rubber, and a phenol resin, the epoxy resin, synthetic rubber and phenol resin constituting three resin components of the composition forming the adhesive layer, a photosensitive hardener which produces Lewis acid upon irradiation with ultraviolet rays, an inorganic filler powder having hydroxyl groups which releases hydroxyl groups upon heating, and an organic solvent, wherein the composition is irradiated with ultraviolet rays followed by heating, and a surface of the adhesive layer is roughened.

10. The substrate according to claim 9, wherein the composition further contains a vulcanization accelerator for the synthetic rubber.

11. The substrate according to claim 9, wherein the composition has curing characteristics represented by a curing temperature of 150° C. or lower within 30 minutes.

12. The substrate according to claim 9, wherein inorganic filler powder releases hydroxyl groups at a temperature no higher than 150° C. so as to accelerate a reaction between the synthetic rubber and phenol resin.

13. The substrate according to claim 9, wherein the photosensitive hardener is an aromatic onium salt.

14. The substrate according to claim 9, wherein amounts of the epoxy resin, synthetic rubber and phenol resin are respectively (15–40), 40–60) and (20–40) in parts by weight, and an amount of the inorganic filler powder is at least 3 parts by weight based on 100 parts of the three resin components.

15. The substrate according to claim 9, wherein an amount of the hardener is 0.2 to 5 parts by weight based on 100 parts of the three resin components.

16. A printed circuit board comprising:
a substrate of an electrically insulating material;
an adhesive layer of a cured resin which is formed by curing a composition which comprises an epoxy resin, a synthetic rubber, and a phenol resin, the epoxy resin, synthetic rubber and phenol resin constituting three resin components of said composition, a photosensitive hardener which produces Lewis acid upon irradiation with ultraviolet rays, and an inorganic filler powder having hydroxyl groups which releases hydroxyl groups upon heating, wherein the composition is cured by irradiation with ultraviolet rays followed by heating, and the surface of the adhesive layer furthest from the substrate is roughened; and
metallic circuit patterns formed on the adhesive layer.

17. The board according to claim 16, wherein the composition further contains a vulcanization accelerator for the synthetic rubber.

18. The board according to claim 16, wherein the composition has curing characteristics represented by a curing temperature of 150° C. or lower within 30 minutes.

19. The board according to claim 16, wherein the inorganic filler powder releases hydroxyl groups at a temperature not higher than 150° C. so as to accelerate a reaction between the synthetic rubber and phenol resin.

20. The board according to claim 16, wherein the photosensitive hardener is an aromatic onium salt.

21. The board according to claim 16, wherein amounts of the epoxy resin, synthetic rubber and phenol resin are respectively (15–40), (40–60) and (20–40) in parts by weight, and an amount of the inorganic filler powder is at least 3 parts by weight based on 100 parts of the three resin components.

22. The board according to claim 16, wherein an amount of the hardener is 0.2 to 5 parts by weight based on 100 parts of the three resin components.

23. The board according to claim 16, wherein the adhesive layer contains an organic solvent, in an amount of 0.001 to 0.5% by weight per weight of the composition.

24. The board according to claim 16, wherein the adhesive layer has a thickness of 10 to 100 $\mu$m.

25. A printed circuit board comprising:
a substrate made of an electrically insulating material;
an adhesive layer, formed on the surface of the substrate, made by curing a composition which comprises an epoxy resin, a synthetic rubber, and a phenol resin, said epoxy resin, said synthetic rubber and said phenol resin constituting three resin components of the composition, a photosensitive hardener for generating Lewis acid upon irradiation with ultraviolet rays, an inorganic filler powder having hydroxyl groups for releasing hydroxyl groups upon heating, a vulcanization accelerator for the rubber, and an organic solvent, wherein the composition is cured by irradiation with ultraviolet rays followed by heating, and a surface of the adhesive layer furthest from the substrate is roughened; and
printed circuits formed on the adhesive layer.

26. The board according to claim 25, wherein the adhesive layer has a thickness of 10 to 100 $\mu$m.

27. The board according to claim 25, wherein the composition has curing characteristics represented by a curing temperature of 150° C. or lower within 30 minutes.

28. The board according to claim 25, wherein the inorganic filler powder releases hydroxyl groups at a temperature no higher than 150° C. so as to accelerate a reaction between the synthetic rubber and phenol resin.

29. The board according to claim 25, wherein the photosensitive hardener is an aromatic onium salt.

30. The board according to claim 25, wherein amounts of the epoxy resin, synthetic rubber and phenol resin are respectively (15–40), (40–60) and (20–40) in parts by weight, and an amount of the inorganic filler powder is at least 3 parts by weight based on 100 parts of the three resin components.

31. The board according to claim 25, wherein an amount of the hardener is 0.2 to 5 parts by weight based on 100 parts of the three resin components.

32. The board according to claim 25, wherein an amount of the solvent is 0.001 to 0.5% by weight per weight of the composition.

* * * * *